(12) United States Patent
Sandhu et al.

(10) Patent No.: US 9,111,932 B2
(45) Date of Patent: Aug. 18, 2015

(54) SEMICONDUCTOR DEVICES COMPRISING INTERCONNECT STRUCTURES AND METHODS OF FABRICATION

(71) Applicant: Micron Technology, Inc., Boise, ID (US)

(72) Inventors: Gurtej S. Sandhu, Boise, ID (US); Nishant Sinha, Boise, ID (US); John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/191,086

(22) Filed: Feb. 26, 2014

(65) Prior Publication Data

US 2014/0175653 A1  Jun. 26, 2014

Related U.S. Application Data

(60) Continuation of application No. 13/085,122, filed on Apr. 12, 2011, now Pat. No. 8,664,112, which is a division of application No. 12/174,393, filed on Jul. 16, 2008, now Pat. No. 7,928,577.

(51) Int. Cl.
| | |
|---|---|
| *H01L 23/522* | (2006.01) |
| *H01L 21/768* | (2006.01) |
| *H01L 25/065* | (2006.01) |
| *H01L 25/00* | (2006.01) |
| *H01L 23/532* | (2006.01) |
| *H01L 27/105* | (2006.01) |

(52) U.S. Cl.
CPC ...... *H01L 23/5226* (2013.01); *H01L 21/76805* (2013.01); *H01L 21/76816* (2013.01); *H01L 21/76879* (2013.01); *H01L 23/53209* (2013.01); *H01L 25/0657* (2013.01); *H01L 25/50* (2013.01); *H01L 27/105* (2013.01); *H01L 2225/06513* (2013.01); *H01L 2225/06517* (2013.01); *H01L 2225/06541* (2013.01); *H01L 2924/0002* (2013.01)

(58) Field of Classification Search
CPC .............. H01L 23/5226; H01L 23/53209; H01L 21/76805; H01L 21/76816
USPC .......... 257/773, 774, 775, E23.141, E23.145, 257/E23.151, E23.152, E23.169, E23.175; 438/597, 598, 618, 622, 637–640, 666, 438/668, 682
See application file for complete search history.

(56) References Cited

U.S. PATENT DOCUMENTS

| | | |
|---|---|---|
| 4,334,349 A | 6/1982 | Aoyama et al. |
| 4,663,831 A | 5/1987 | Birrittella et al. |
| 4,857,479 A | 8/1989 | McLaughlin et al. |

(Continued)

OTHER PUBLICATIONS

Topol et al., "Three-Dimensional Integrated Circuits," IBM J. Res. & Dev., vol. 50, No. 4/5, Jul./Sep. 2006, pp. 491-506.

*Primary Examiner* — Michele Fan
(74) *Attorney, Agent, or Firm* — TraskBritt

(57) ABSTRACT

Semiconductor devices comprise at least one integrated circuit layer, at least one conductive trace and an insulative material adjacent at least a portion of the at least one conductive trace. At least one interconnect structure extends through a portion of the at least one conductive trace and a portion of the insulative material, the at least one interconnect structure comprising a transverse cross-sectional dimension through the at least one conductive trace which differs from a transverse cross-sectional dimension through the insulative material.

20 Claims, 4 Drawing Sheets

(56) References Cited

U.S. PATENT DOCUMENTS

| | | | |
|---|---|---|---|
| 4,977,105 A * | 12/1990 | Okamoto et al. | 438/639 |
| 5,106,778 A | 4/1992 | Hollis et al. | |
| 5,204,286 A * | 4/1993 | Doan | 438/618 |
| 5,256,585 A * | 10/1993 | Bae | 438/304 |
| 5,262,352 A | 11/1993 | Woo et al. | |
| 5,275,972 A | 1/1994 | Ogawa et al. | |
| 5,355,023 A | 10/1994 | Tomioka et al. | |
| 5,376,562 A * | 12/1994 | Fitch et al. | 438/155 |
| 5,439,848 A | 8/1995 | Hsu et al. | |
| 5,661,080 A | 8/1997 | Hwang et al. | |
| 5,726,098 A | 3/1998 | Tsuboi | |
| 5,824,579 A * | 10/1998 | Subramanian et al. | 438/238 |
| 5,900,664 A * | 5/1999 | En | 257/356 |
| 6,001,717 A | 12/1999 | Lien | |
| 6,022,804 A | 2/2000 | Yano et al. | |
| 6,180,514 B1 | 1/2001 | Yeh et al. | |
| 6,187,678 B1 | 2/2001 | Gaynes et al. | |
| 6,194,261 B1 * | 2/2001 | Imai | 438/238 |
| 6,204,161 B1 | 3/2001 | Chung et al. | |
| 6,221,769 B1 | 4/2001 | Dhong et al. | |
| 6,242,332 B1 * | 6/2001 | Cho et al. | 438/587 |
| 6,245,664 B1 | 6/2001 | Miyai | |
| 6,255,183 B1 | 7/2001 | Schmitz et al. | |
| 6,258,683 B1 * | 7/2001 | Besser et al. | 438/306 |
| 6,291,888 B1 * | 9/2001 | Bhat et al. | 257/758 |
| 6,316,368 B1 | 11/2001 | Lin et al. | |
| 6,331,478 B1 * | 12/2001 | Lee et al. | 438/592 |
| 6,400,024 B1 | 6/2002 | Drury et al. | |
| 6,441,494 B2 | 8/2002 | Huang et al. | |
| 6,468,919 B2 * | 10/2002 | Chien et al. | 438/719 |
| 6,479,873 B1 * | 11/2002 | Yoshiyama et al. | 257/382 |
| 6,486,549 B1 | 11/2002 | Chiang | |
| 6,512,299 B1 * | 1/2003 | Noda | 257/774 |
| 6,589,837 B1 * | 7/2003 | Ban et al. | 438/239 |
| 6,677,682 B1 * | 1/2004 | Fujiki et al. | 257/797 |
| 6,716,746 B1 | 4/2004 | Kim et al. | |
| 6,767,616 B2 | 7/2004 | Ooi et al. | |
| 7,208,410 B2 | 4/2007 | Larson | |
| 7,211,510 B2 | 5/2007 | Meadows | |
| 7,300,857 B2 | 11/2007 | Akram et al. | |
| 7,312,400 B2 | 12/2007 | Ito et al. | |
| 7,564,135 B2 | 7/2009 | Park | |
| 7,928,577 B2 | 4/2011 | Sandhu et al. | |
| 2001/0036722 A1 | 11/2001 | Yoo et al. | |
| 2002/0081841 A1 | 6/2002 | Ireland et al. | |
| 2002/0175381 A1 * | 11/2002 | Choi et al. | 257/369 |
| 2003/0015796 A1 | 1/2003 | Hasunuma | |
| 2005/0051353 A1 | 3/2005 | Chong et al. | |
| 2005/0085067 A1 | 4/2005 | Sir et al. | |
| 2005/0184348 A1 | 8/2005 | Youn et al. | |
| 2005/0208725 A1 * | 9/2005 | Kim et al. | 438/286 |
| 2006/0234487 A1 * | 10/2006 | Kim et al. | 438/597 |
| 2006/0246710 A1 | 11/2006 | Cheong et al. | |
| 2006/0270215 A1 * | 11/2006 | Lee et al. | 438/637 |
| 2007/0032074 A1 | 2/2007 | Kwak et al. | |
| 2007/0045844 A1 * | 3/2007 | Andry et al. | 257/738 |
| 2007/0090325 A1 * | 4/2007 | Hwang et al. | 252/79.1 |
| 2007/0232059 A1 | 10/2007 | Abe | |
| 2007/0271783 A1 | 11/2007 | Ikeda | |
| 2007/0281461 A1 | 12/2007 | Jang | |
| 2008/0179650 A1 * | 7/2008 | Kawakita | 257/296 |
| 2008/0237878 A1 * | 10/2008 | Satou | 257/773 |
| 2009/0051039 A1 | 2/2009 | Kuo et al. | |
| 2009/0146283 A1 | 6/2009 | Chen et al. | |
| 2011/0195547 A1 | 8/2011 | Sandhu et al. | |

* cited by examiner

SEMICONDUCTOR DEVICES COMPRISING INTERCONNECT STRUCTURES AND METHODS OF FABRICATION

CROSS-REFERENCE TO RELATED APPLICATIONS

This application is a continuation of U.S. patent application Ser. No. 13/085,122, filed Apr. 12, 2011, now U.S. Pat. No. 8,664,112, issued Mar. 4, 2014, which is a divisional of U.S. patent application Ser. No. 12/174,393, filed Jul. 16, 2008, now U.S. Pat. No. 7,928,577, issued Apr. 19, 2011, the disclosure of each of which is hereby incorporated in its entirety herein by this reference.

TECHNICAL FIELD

This invention, in various embodiments, relates generally to semiconductor devices, such as memory devices, and particularly to interconnect structures for semiconductor devices and methods of forming such interconnect structures.

BACKGROUND

Integrated circuit (IC) devices are used in nearly all areas of modern electronics. As integrated circuit devices become more complex, e.g., including greater numbers of circuits, minimizing the size of the integrated circuit device packages becomes increasingly more challenging. One conventional solution to providing increased density with decreased package size has been to stack layers of integrated circuits fowling multi-layered or three-dimensional structures. One common application for such a structure is found in conventional memory devices in which two or more layers of memory arrays are fabricated in a stack to form a multi-layered or three-dimensional memory array structure.

Typically, multiple layers in the three-dimensional structure have at least some interconnecting structures to electrically interconnect the individual layers. For example, in the memory array case, the multiple layers of memory arrays are conventionally integrated with controlling circuitry in a base layer of the memory device by forming a plurality of interconnect structures electrically connecting the multiple layers of memory to the controlling circuitry. In another example, conventional integrated circuit layers will typically all require power and ground connections, which can be provided by a single, interconnect structure extending through each of the integrated circuit layers.

In order to ensure adequate electrical connection, conventional interconnect structures require a relatively large cross-section, which, in turn, requires more lateral space or "real estate" on a semiconductor die. The need for real estate in order to provide such electrical interconnections may reduce the ability to maximize the density of the integrated circuit in order to obtain the greatest functionality in the smallest package size. When the transverse cross-sectional dimension of the electrical interconnections is reduced to make the electrical interconnections smaller, the contact area is also reduced. This decrease in contact area results in an increase in the contact resistance. Thus, the configuration of the interconnect structures for a device incorporating multiple layers or arrays can be a significant consideration in package design to minimize package size, enhance memory density, or both.

DETAILED DESCRIPTION

The illustrations presented herein are, in some instances, not actual views of any particular semiconductor device or interconnect structure, but are merely idealized representations, which are employed to describe the present invention. Additionally, elements common between figures may retain the same numerical designation.

Figure 1:
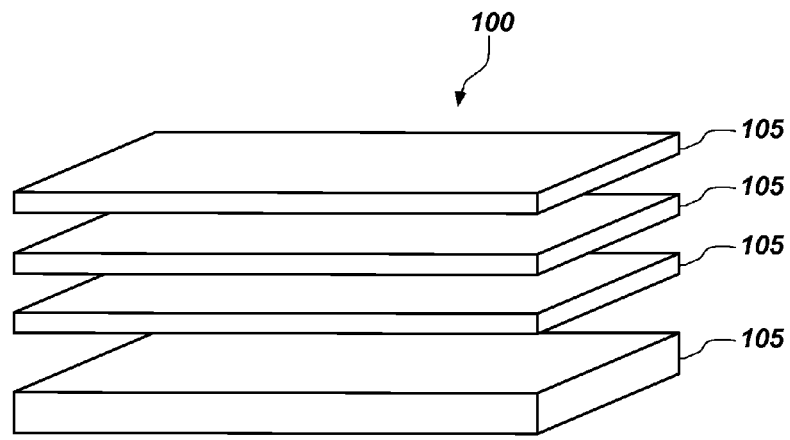
FIG. 1 illustrates an exploded view of a portion of a three-dimensional electronic device according to an embodiment of the present invention.

Referring to FIG. 1, an exploded view of a portion of a three-dimensional electronic device 100, also referred to herein as a stacked integrated circuit (IC) device, is shown according to an embodiment of the present invention. The stacked IC device 100 may comprise a stack of integrated circuit (IC) layers 105. The IC layers 105 may be formed by conventional methods as are well known to those of ordinary skill in the art. Furthermore, if formed separately, the individual IC layers 105 may be stacked by conventional methods. Two or more IC layers 105 may be interconnected by one or more interconnect structures extending between and electrically connecting the IC layers 105, as described in more detail herein below. By way of example and not limitation, the stacked IC device 100 may comprise any one of a memory device, an imager device, an integrated processor/memory device, an analog device, a sensor array, a MEMS (Micro-Electro-Mechanical System) device, etc.

Figure 2:
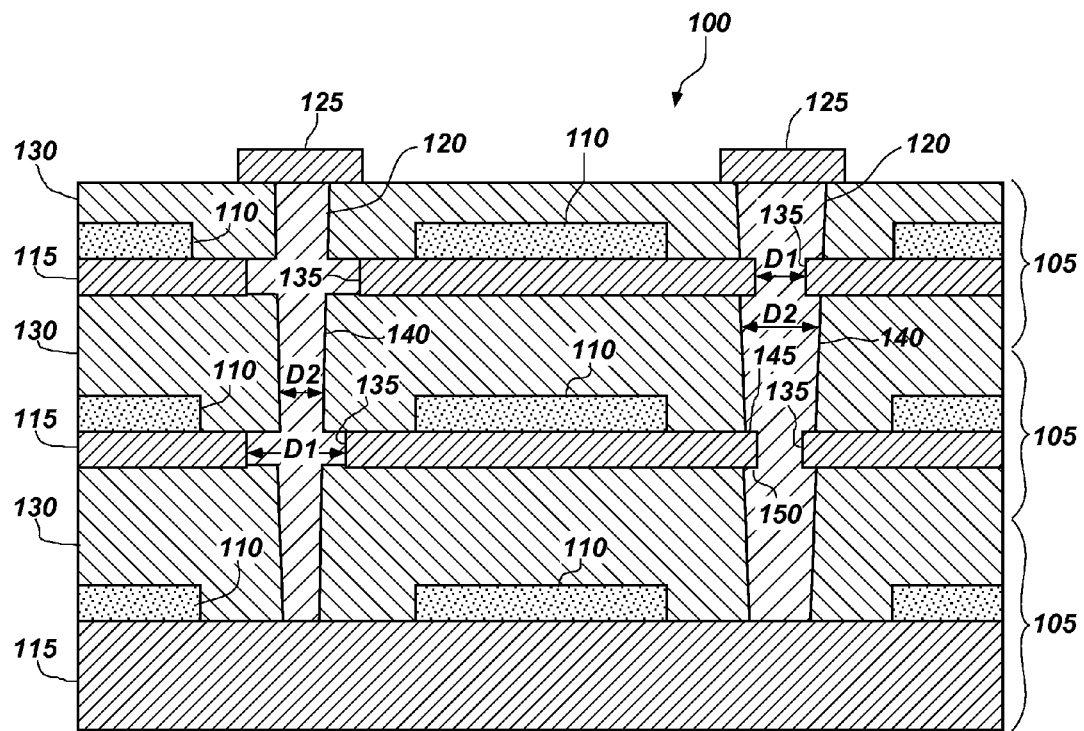
FIG. 2 is a partial cross-sectioned view of a stacked IC device comprising a plurality of IC layers including memory arrays.

In some embodiments, the stacked IC device 100 may comprise a memory device in which at least some of the IC layers 105 comprise memory arrays. FIG. 2 is a partial cross-sectional view of a stacked IC device 100 configured as a memory device comprising a plurality of IC layers 105 including memory arrays 110. Each IC layer 105 may comprise one or more memory arrays 110. By way of example only, the memory device may comprise between nine and thirty-two memory array circuit layers, but there is no particular limit to the number of layers. Conventional memory array circuit layers may comprise a plurality of memory cells, busing electrodes, and enabling gates for selection of specific rows or columns of the memory array. The one or more memory arrays 110 are electrically connected to conductive pathways, which may be configured as conductive traces 115. By way of example and not limitation, the conductive traces 115 may provide electrical connections to I/O power and ground or bias bus lines, memory circuit layer selects, memory macro cell column selects, data lines, gate-line multiplexer selects, etc. The base IC layer 105 of the memory device may comprise circuitry for controlling the memory arrays 110. The controller circuitry may comprise conventional CMOS (complementary metal-oxide-semiconductor) circuitry including sense amps, address, control and drive logic, etc.

The stacked IC device 100 may further include one or more interconnect structures 120 coupled at a connecting point with one or more conductive traces 115 in each IC layer 105. The interconnect structures 120 may, therefore, provide mutual electrical interconnection between a plurality of IC layers 105, as well as between one or more IC layers 105 and the controller circuitry. By way of example and not limitation, the IC device 100 in FIG. 2 may comprise interconnect structures 120 to provide electrical connection to a ground plane in each IC layer 105. The interconnect structures 120 may comprise an aperture extending through a portion of one or more of the connecting points of the conductive traces 115, as well as a portion of an insulative material 130 mutually electrically isolating the circuitry of the multiple IC layers 105. The aperture may be at least partially filled (e.g., at least partially lined) with a conductive material, such as copper. The interconnect structures 120 are configured such that the cross-sectional dimension of the interconnect structures 120, through the connecting points, differs from the cross-sectional dimension through the adjacent insulative material 130.

In one embodiment, as illustrated by the interconnect structure 120 on the left in FIG. 2, the interconnect structure 120 may comprise a transverse cross-sectional dimension D1 through the connecting points of the one or more conductive traces 115 that is larger than the transverse cross-sectional dimension D2 of the interconnect structure 120 through the adjacent insulative material 130. In such embodiments, the contact end 135 of the connecting points of the conductive traces 115 are recessed into the insulative material 130 or, in other words, into the sidewall 140 of the interconnect structure 120.

In another embodiment illustrated by the interconnect structure 120 on the right in FIG. 2, the transverse cross-sectional dimension D1 of the interconnect structure 120, through the connecting points of the conductive traces 115, is smaller than the transverse cross-sectional dimension D2 through the adjacent insulative material 130. Thus, the contact ends 135 of the connecting points extend inward beyond the sidewall 140 of the interconnect structure 120 into the interconnect structure 120 itself. In other words, the connecting points overhang the sidewall 140 of the insulative material 130, exposing a portion of a top surface 145 and a bottom surface 150 of each of the connecting points of the conductive traces 115.

Figure 3:
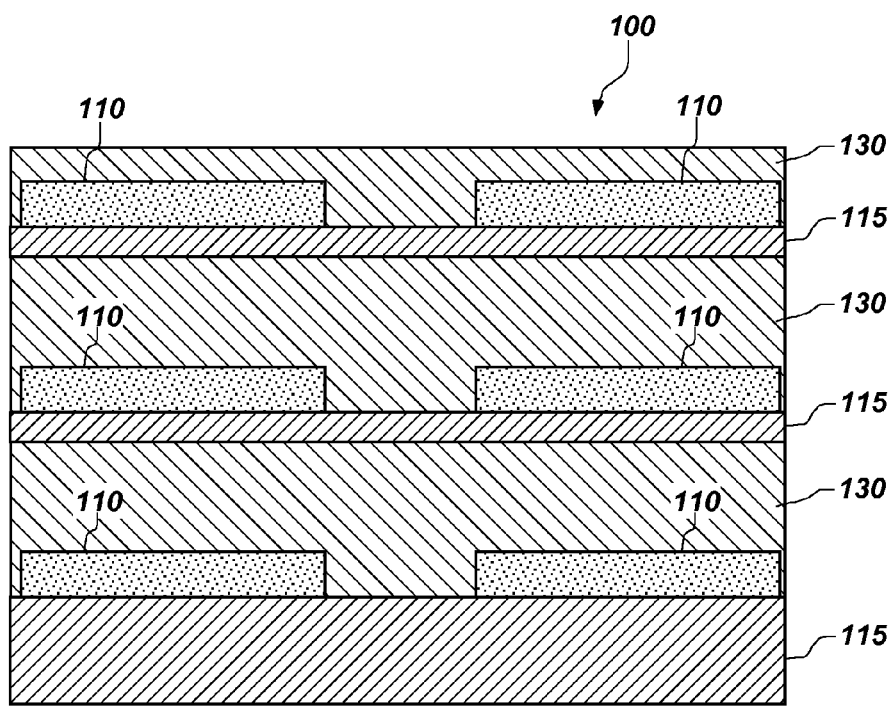
FIG. 3 shows a partial cross-sectioned view of a stacked IC device according to one embodiment comprising a memory device.

FIG. 3 shows a partial cross-sectioned view of a stacked IC device 100 according to one embodiment comprising a memory device. The stacked IC device 100 configured as a memory device may be formed by forming a plurality of IC layers 105 (FIG. 1) vertically stacked in a three-dimensional fashion. The layers may be formed and stacked according to methods known to those of ordinary skill in the art. By way of example, the lowermost IC layer 105 may be fabricated with circuits by conventional methods, e.g., bulk silicon substrate or a silicon surface layer of a silicon on insulator (SOI) wafer. Then, the next IC layer 105 may be formed on the base wafer. By way of example and not limitation, any subsequent IC layer 105 may be formed on a previous IC layer 105 by epitaxial silicon (epi Si) growth, recrystallization of amorphous silicon, wafer bonding, etc. Device processing may be completed on that subsequent IC layer 105, which, in the case of a memory device, may include forming memory arrays 110, as well as conductive traces 115 patterned thereon. In some embodiments, the conductive traces 115 may comprise a conductive metal material such as W, Cu, $WSi_x$, etc., or the conductive traces 115 may comprise a doped silicon, such as silicon doped with P, B, As, C, etc., or combinations thereof. Such processes of adding IC layers 105 may be repeated until the desired number of IC layers 105 are formed. In many cases, these processing acts, as well as the subsequently described processing acts, are carried out at temperatures below about 400° C. so as to avoid possible detrimental phase changes in the device materials, which may cause the device to fail and/or to avoid grain growth on conductive traces, etc.

As the IC layers 105 are formed, insulative material 130 is disposed between each IC layer 105 to electrically isolate the circuits on each IC layer 105 from those of other IC layers 105. By way of example and not limitation, the insulative material 130 may comprise a dielectric material such as silicon dioxide ($SiO_2$), phosphosilicate glass (PSG), borophosphosilicate glass (BPSG), etc., and may be formed by conventional methods.

Figure 4:
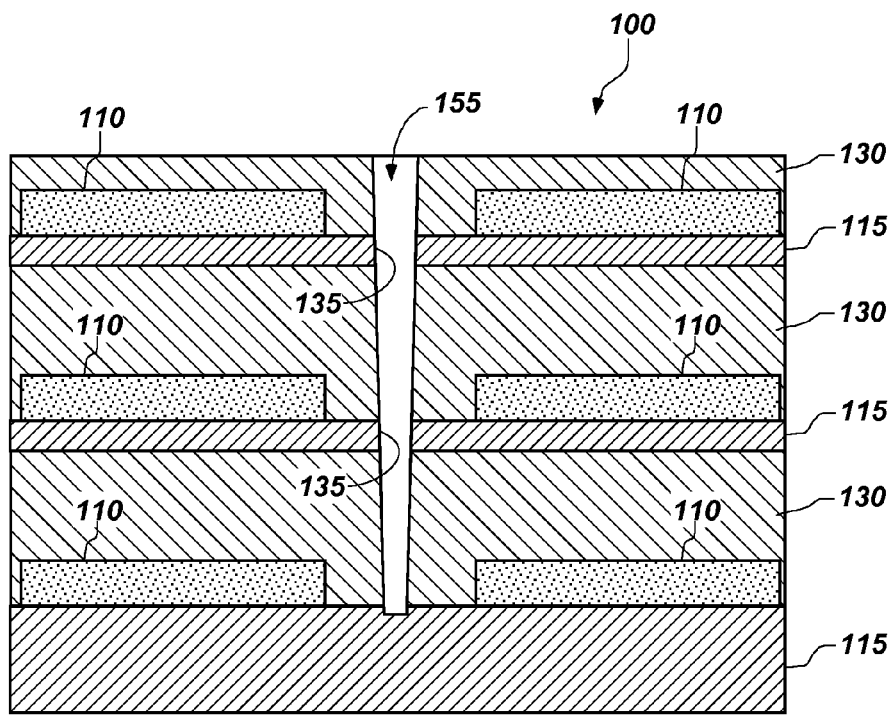
FIG. 4 is a partial cross-sectioned view of an embodiment of the memory device of FIG. 3 further comprising an aperture fainted therein.

After the stacked IC device 100 is formed, one or more apertures 155 are formed therein, as shown in FIG. 4. The one or more apertures 155 may each comprise a relatively small transverse cross-sectional dimension, so as to reduce the amount of chip area used in the stacked IC device 100 and, in turn, may aid in reducing the size of the stacked IC device 100. In some embodiments, each of the one or more apertures 155 may comprise a nominal transverse cross-sectional dimension of less than or equal to about 500 nm. To form the apertures 155 with such a relatively small transverse cross-sectional dimension, a conventional reactive ion etching process may be employed. The one or more apertures 155 may be formed to extend through at least one conductive trace 115 and through at least one portion of the insulative material 130 adjacent the at least one conductive trace 115. As shown in FIG. 4, the aperture 155 may be formed to extend through a portion of each IC layer 105, including a connecting point of each conductive trace 115, as well as through the insulative material 130 adjacent to each connecting point. The transverse cross-sectional dimension of the aperture 155 may be at least substantially constant through each IC layer 105 or the aperture 155 may comprise a slight taper such that the lower portion of the aperture 155 has a slightly smaller transverse cross-sectional dimension than the upper portion of the aperture 155. Such a taper may be a result of the process used to form the aperture 155, causing the contact area near the bottom of the aperture 155 to be smaller compared to the contact area near the top of the aperture 155.

The relatively small transverse cross-sectional dimension of the aperture 155 may result in a relatively small exposed surface area at the contact end 135 of the connecting points of the conductive traces 115. Additional processing steps may, therefore, be employed to increase the exposed surface area of the contact ends 135. In some embodiments, such as that shown in FIG. 5, each contact end 135 of the connecting points may be recessed from the sidewall 140 of the aperture 155, while in other embodiments, such as that shown in FIG. 6, each contact end 135 of the connecting points may overhang the sidewall 140.

Figure 5:
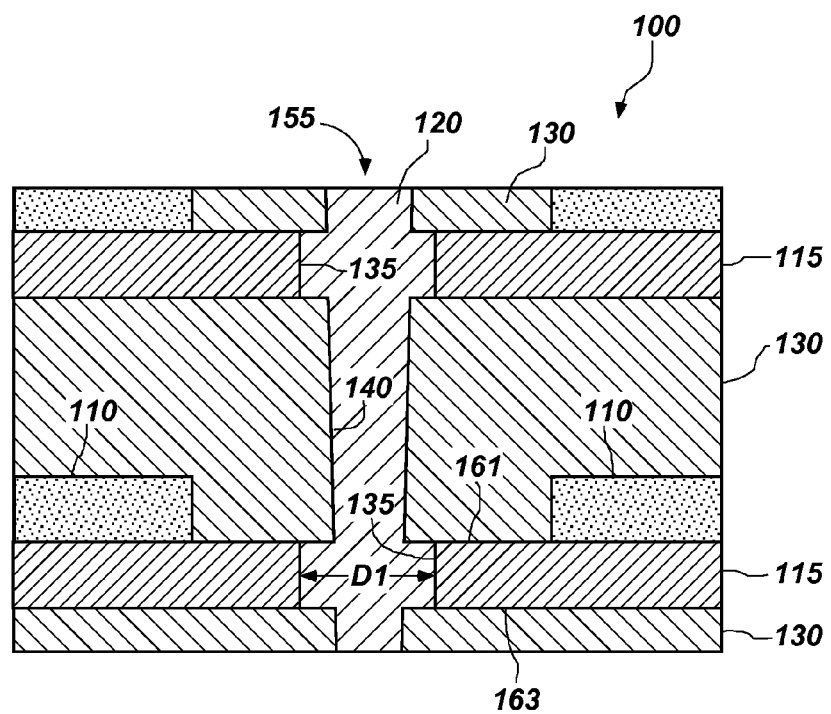
FIG. 5 illustrates a partial cross-sectioned view of one embodiment of the memory device of FIG. 4 comprising contact ends recessed from a sidewall of the aperture.

Referring to FIG. 5, after forming the initial aperture 155 the transverse cross-sectional dimension D1 at the contact end 135 may be increased by selectively removing a portion of the contact end 135. In at least some embodiments, the portion of the contact end 135 may be removed by employing an etchant configured to selectively etch portions of the contact end 135 without substantially removing portions of the insulative material 130. A conventional wet or dry etching process may be employed in which the etchant is selected to selectively etch the contact ends 135 of the conductive traces 115. As described above, in some embodiments the conductive traces 115 may comprise a doped silicon. By way of example and not limitation, a suitable etchant for selectively etching the doped silicon in a conventional reactive ion etching process may comprise $HBr/Cl_2/O_2$. A wide range of ratios may be employed, but typically the volume of HBr is less than the volume of $O_2$ and the volume of $O_2$ is less than the volume of $Cl_2$. Furthermore, if there is a relatively high Ar content in the doped silicon, approximately 5% of $SF_6$ may be added to the etchant.

The depth of the recesses may be determined according to the desired increase in the exposed surface area of the contact end 135. The increase in exposed surface area is dependent on the thickness of the conductive traces 115 at the contact ends 135 and the original diameter of the aperture 155, as illustrated by way of a non-limiting example in the following Tables 1 and 2 and described herein below. By way of example and not limitation, the thickness between the top surface 161 and the bottom surface 163 of the conductive traces 115, as oriented in FIG. 5, may be from about 100 nanometers (nm) to about 500 nm. By way of example and not limitation and referring to Table 1 below, in an embodiment in which the conductive traces 115 are approximately 500 nm thick and the original diameter of the aperture 155 is approximately 300 nm, a recessed diameter D1 of 310 nm results in a percent increase in total contact area of about 3.33%. Similarly, a recessed diameter D1 of 330 nm results in a percent increase of about 10%, and a recessed diameter D1 of 350 nm results in a percent increase of about 16.7%. In any of these embodiments, the transverse cross-sectional dimension of the aperture 155, excluding the portions wherein conductive trace material has been removed, remains at least substantially unchanged.

TABLE 1

| Dielectric Diameter (nm) | Doped Si Diameter (nm) | Thickness of Si layer (nm) | Vertical Contact area ($nm^2$) | Percent Change from nominal |
|---|---|---|---|---|
| 300 | 300 | 500 | 471,239 | |
| 300 | 310 | 500 | 486,947 | 3.33 |
| 300 | 330 | 500 | 518,363 | 10.0 |
| 300 | 350 | 500 | 549,779 | 16.7 |

In conventional integrated circuit devices, a similar change in total contact area may be accomplished by similarly increasing the diameter D1, such as from 300 nm to 350 nm to achieve a percent increase of 16.7% as shown in Table 2 below. However, in such conventional devices the entire aperture was increased in size, thereby increasing a required size of a die for a given IC capacity by reducing the ability to achieve higher levels of IC density. By employing embodiments as described, a relatively small aperture may be employed in order to increase the IC density, and reduce the size for a given density, of the integrated circuit, while still providing adequate surface area at the contact ends 135.

TABLE 2

| Dielectric Diameter (nm) | Doped Si Diameter (nm) | Thickness of Si layer (nm) | Vertical Contact area ($nm^2$) | Percent Change from nominal |
|---|---|---|---|---|
| 300 | 300 | 500 | 471,239 | |
| 310 | 310 | 500 | 486,947 | 3.33 |
| 330 | 330 | 500 | 518,363 | 10.0 |
| 350 | 350 | 500 | 549,779 | 16.7 |

A conductive material may subsequently be disposed within the aperture 155. In some embodiments, the aperture 155 may be filled with a conductive material such as W, Cu, Al, Pd, Co, Ru, Ni, Pt, etc. The conductive material may be disposed by conventional methods such as electroless plating. Depending on the material composition of the conductive material (e.g., Cu), an optional seed layer may be formed prior to disposing the material in the aperture 155. Some non-limiting examples of suitable seed layer material may include Cu, Ru, etc. The seed layer may be disposed by conventional means, such as Atomic Layer Deposition (ALD) or electroless plating. Furthermore, for some conductive materials (e.g., Cu), a barrier layer may also be formed in the aperture 155 prior to forming the seed layer. Non-limiting examples of suitable barrier film materials include TiN, TaN, etc. The barrier layer may be formed by disposing a suitable material by conventional methods, such as ALD. In some embodiments, prior to disposing the conductive material in the aperture 155, and prior to forming the optional barrier layer and seed layer, a silicide may be formed over the exposed contact ends 135.

By way of an example, and not limitation, in some embodiments in which the conductive traces 115 comprise a doped silicon, a silicide may be formed on the exposed contact ends 135 by disposing Ni thereon. The Ni may be disposed by conventional means, such as by ALD. The Ni may react with the silicon at temperatures lower than 400° C. to form $NiSi_x$, which may improve conductive properties between the conductive material in the aperture 155 and the conductive traces 115. If a conductive material such as Cu is being employed to fill the aperture 155, a barrier layer may be formed by ALD, followed by a seed layer. If the conductive material comprises another material such as Pd, the conductive material may be disposed within the aperture 155 without a barrier layer or a seed layer. The conductive material may be disposed by electroless deposition to fill the aperture 155 and electrically couple the interconnect structure 120 to the exposed contact end 135. Top level common routing or conductive traces 125 (FIG. 2) may also be formed on the upper surface of the stacked IC device 100 and electrically coupled to at least some of the interconnect structures 120.

Figure 6:
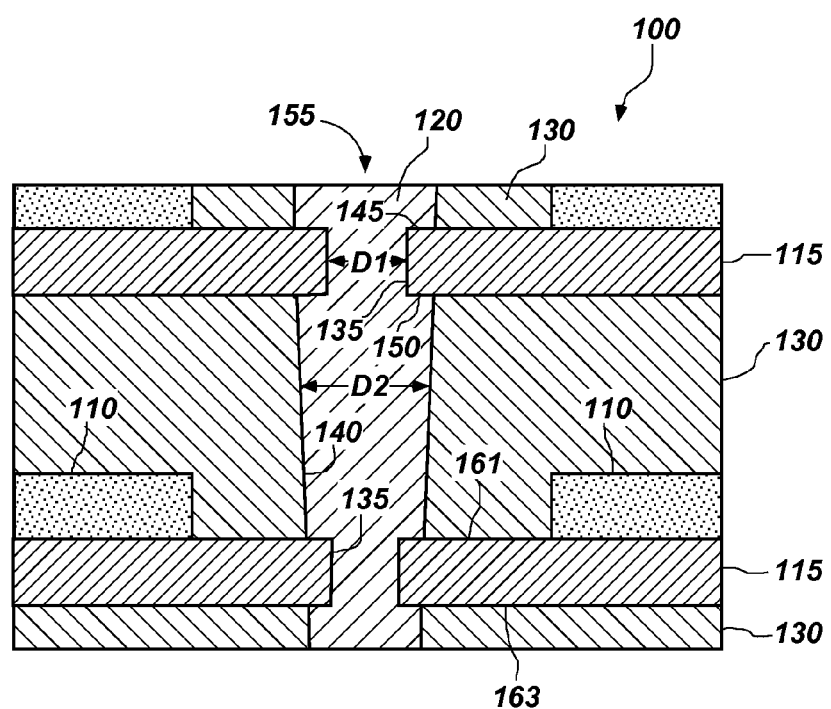
FIG. 6 illustrates a partial cross-sectioned view of one embodiment of the memory device of FIG. 4 in which the contact ends overhang the sidewall of the aperture.

Referring to FIG. 6, in some embodiments of the interconnect structure 120, the contact ends 135 of the connecting points may overhang the sidewall 140 of aperture 155. After forming the initial aperture 155 as described with relation to FIG. 4, the transverse cross-sectional dimension D2, through the insulative material 130, may be increased by selectively removing a portion of the insulative material 130. In at least some embodiments, the portion of the insulative material 130 may be removed by employing an etchant configured to selectively etch portions of the insulative material 130 without substantially removing portions of the contact ends 135. A conventional wet or dry etching process may be employed in which the etchant is selected to selectively etch the insulative material 130. As described above, in some embodiments the insulative material 130 may comprise an insulative oxide such as silicon dioxide ($SiO_2$). By way of example and not limitation, a suitable etchant for selectively etching an insulative material 130 comprising silicon dioxide using a conventional reactive ion etching process may comprise $C_xH_yF_z$/$O_2$/Ar in a 1:1:8 volumetric ratio, and where x=1, 4, or 6; y=0 through 4, and z=0 through 8. Examples may include $CH_4$, $CH_2F_2$, $C_4F_8$, $C_4F_6$, $C_6F_6$, etc.

Similar to the embodiment described with relation to FIG. 5, the depth to which the insulative material 130 is recessed may be determined according to the desired increase in the exposed surface area of the contact end 135. The increase in surface area exposed is dependent on the thickness between the top surface 161 and the bottom surface 163 (as oriented in FIG. 6) of the conductive traces 115 at the contact ends 135 and the original diameter of the aperture 155. By way of example and not limitation, and with reference to Table 3, in an embodiment in which the conductive traces 115 are approximately 500 nm thick and the original diameter of the aperture 155 is approximately 300 nm, a recessed diameter D2 of 310 nm of the aperture 155 above and below a conductive trace 115 results in a percent increase in total exposed contact area of about 4.1%. The percent increase in total contact area for this embodiment is a result of the increase in horizontal contact area from the exposure of the top and bottom sides of the contact ends 135, since the vertical contact area remains the same from the diameter D1 at the contact ends 135 remaining unchanged. In another example, a recessed diameter D2 of 330 nm results in a percent increase of total exposed contact area of about 12.6%, and a recessed diameter D2 of 350 nm results in a percent increase of exposed total contact area of about 21.7%. In comparison, and referring to Table 2 above, a change in diameter in the recess of a conventional integrated circuit device from 300 nm to 350 nm results in a percent increase of total contact area of approximately 16.7%. By employing embodiments as described, a relatively small aperture may be employed in order to increase the IC density, and reduce the required size, of the integrated circuit, while still providing adequate exposed surface area at the contact ends 135.

TABLE 3

| Dielectric Diameter (nm) | Doped Si Diameter (nm) | Thickness of Si layer (nm) | Vertical Contact area ($nm^2$) | Horizontal Contact area ($nm^2$) | Total Contact area ($nm^2$) | Percent Change from nominal |
|---|---|---|---|---|---|---|
| 300 | 300 | 500 | 471,239 | 0 | 471,239 | |
| 310 | 300 | 500 | 471,239 | 9,582 | 490,403 | 4.1 |
| 330 | 300 | 500 | 471,239 | 29,688 | 530,615 | 12.6 |
| 350 | 300 | 500 | 471,239 | 51,051 | 573,341 | 21.7 |

In a manner similar to that of the embodiment described with relation to FIG. 5, a conductive material may subsequently be disposed within the aperture 155. In some embodiments, the aperture 155 may be filled with a conductive material such as W, Cu, Al, Pd, Co, Ru, Ni, Pt, etc. The conductive material may be disposed by conventional methods such as electroless plating. Depending on the material composition of the conductive material (e.g., Cu), an optional seed layer may be fainted prior to disposing the material in the aperture 155. The seed layer may be disposed by conventional means, such as Atomic Layer Deposition (ALD) or electroless plating. Some non-limiting examples of suitable seed layer material may include Cu, Ru, etc. Furthermore, for some conductive material (e.g., Cu), a barrier layer may also be formed in the aperture 155 prior to forming the seed layer. Non-limiting examples of suitable barrier film materials include TiN, TaN, etc. The barrier layer may be formed by disposing a suitable material by conventional methods, such as ALD. In some embodiments, prior to disposing the conductive material in the aperture 155, and prior to forming the optional barrier layer and seed layer, a silicide may be formed over the exposed contact ends 135.

By way of an example, and not limitation, in some embodiments in which the conductive traces 115 comprise a doped silicon, a silicide may be formed on the exposed contact ends 135 by disposing Ni thereon. The Ni may be disposed by conventional means, such as by ALD. The Ni may react with the silicon at temperatures lower than 400° C. to form $NiSi_x$, which may improve conductive properties between the conductive material in the aperture 155 and the conductive traces 115. If a conductive material such as Cu is being employed to fill the aperture 155, a barrier layer may be formed by ALD, followed by a seed layer. If the conductive material comprises another material such as Pd, the conductive material may be disposed within the aperture 155 without a barrier layer or a seed layer. The conductive material may be disposed by electroless deposition to fill the aperture 155 and electrically couple the interconnect structure 120 to the exposed contact end 135. Top level common routing or conductive traces 125 (FIG. 2) may also be formed on the upper surface of the stacked IC device 100 and electrically coupled to at least some of the interconnect structures 120.

For the embodiments shown in FIGS. 5 and 6, the increased surface area exposed at the contact ends 135 may reduce contact resistance between the interconnect structures 120 and the conductive traces 115. Contact resistance is inversely proportional to the contact area. In other words, as the contact area increases, the contact resistance decreases. Furthermore, by adjusting the exposed surface area at the contact ends 135, the designers are better able to achieve a desired contact resistance at each contact end 135 while maintaining smaller overall transverse cross-sectional dimensions.

Figure 7:
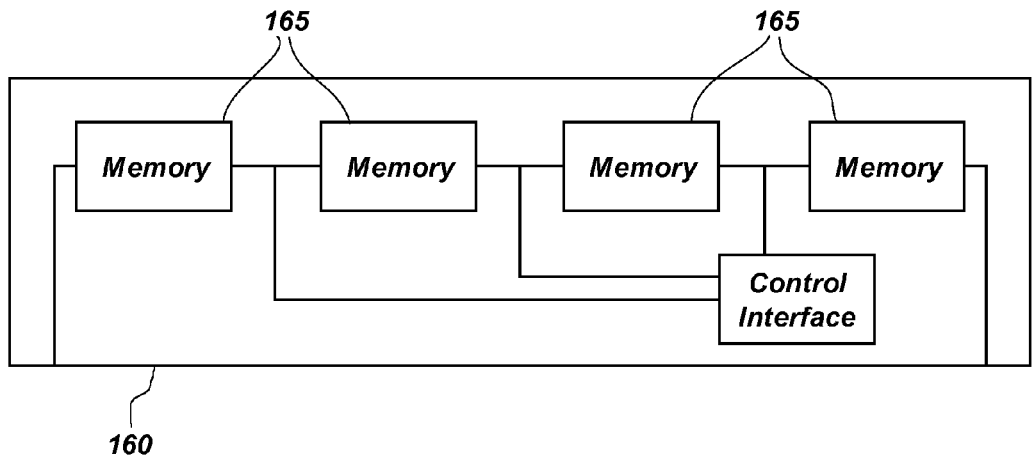
FIG. 7 is a schematic of a memory card containing a plurality of semiconductor memory devices containing at least one interconnect structure according to one embodiment of the invention.

FIG. 7 shows a memory card containing a plurality of semiconductor memory devices containing a stack of IC layers and at least one interconnect structure according to one embodiment of the invention. A substrate 160, such as a printed circuit board (PCB), in accordance with an embodiment of the present invention, includes a plurality of semiconductor memory devices 165, at least one of which includes a stacked memory device incorporating at least one embodiment of an interconnect structure 120 as described herein. It should be understood that each semiconductor memory device 165 might comprise one of a wide variety of devices, including, by way of example and not limitation, Dynamic RAM (DRAM) devices, Static RAM (SRAM) devices, Flash memory devices, as well as any other type of memory device.

Figure 8:
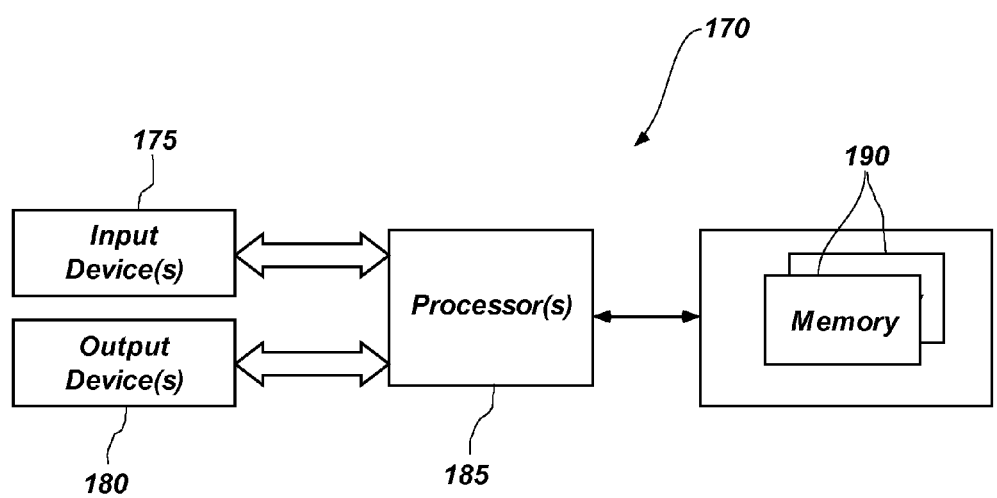
FIG. 8 is a schematic of a computing system diagram showing at least one semiconductor memory device containing at least one interconnect structure according to one embodiment of the invention.

As shown in FIG. 8, an electronic system 170, such as a computer system, in accordance with an embodiment of the present invention, comprises at least one input device 175, at least one output device 180, at least one processor 185, and at least one memory device 190. As used herein, the term "computer system" includes not only computers such as personal computers and servers, but also wireless communications devices (e.g., cell phones, personal digital assistants configured for text messaging and email), cameras, chip sets, set top boxes, controllers, vehicle and engine control and sensor systems, and other combinations of the above-referenced input, output, processor and memory devices. The at least one memory device 190 comprises at least one semiconductor memory device 165 comprising a stack of IC layers 105 incorporating at least one of the interconnect structures 120 described herein according to an embodiment of the invention. As a non-limiting example, the at least one memory device 190 may comprise a module configured as a substrate 160 bearing multiple semiconductor memory devices 165 as is illustrated in FIG. 7. It should be understood that the semiconductor memory devices 165 may be selected from a wide variety of devices, including, by way of non-limiting examples, Dynamic RAM (DRAM) devices, Static RAM (SRAM) devices, Flash memory devices, or combinations thereof, etc.

CONCLUSION

Various embodiments of the present invention are described above and directed toward embodiments of a semiconductor device comprising a plurality of integrated circuit layers having one or more interconnect structures extending through at least some of the plurality of IC layers. In one embodiment at least one IC layer may comprise at least one conductive trace and an insulative material adjacent at least a portion of the at least one conductive trace. At least one interconnect structure may extend through a portion of at least one conductive trace and a portion of the insulative material. The at least one interconnect structure comprises a transverse cross-sectional dimension through the at least one conductive trace, which differs from a transverse cross-sectional dimension through the insulative material. In some embodiments, the transverse cross-sectional dimension of the interconnect structure through the at least one conductive trace may be smaller than the transverse cross-sectional dimension through the insulative material. In other embodiments, the transverse cross-sectional dimension of the interconnect structure through the at least one conductive trace may be larger than the transverse cross-sectional dimension through the insulative material.

In another embodiment, a memory card comprises at least one memory device. The at least one memory device may comprise a plurality of stacked integrated circuit layers comprising at least one conductive trace, and in which at least some of the integrated circuit layers comprise at least one memory array. At least one interconnect structure may extend through a portion of the at least one conductive trace and may comprise a transverse cross-sectional dimension through the at least one conductive trace, which differs from a transverse cross-sectional dimension of a sidewall of the at least one interconnect structure.

In still other embodiments, an electronic system comprises a processor and at least one memory device. The at least one memory device may comprise a plurality of stacked integrated circuit layers comprising at least one conductive trace, at least some of the integrated circuit layers comprising at least one memory array. At least one interconnect structure may extend through a portion of the at least one conductive trace and comprises a transverse cross-sectional dimension through the at least one conductive trace, which differs from a transverse cross-sectional dimension of a sidewall of the at least one interconnect structure.

In yet another embodiment, a method of interconnecting a plurality of integrated circuit layers may comprise forming at least one aperture through a portion of at least one conductive trace and through a portion of at least one insulative material adjacent the at least one conductive trace. The surface area of a contact end of the at least one conductive trace may be increased, and the at least one aperture may be at least partially filled with a conductive material.

In another embodiment, a method of foaming a memory device may comprise positioning a plurality of integrated circuit layers in a stacked configuration. At least some integrated circuit layers of the plurality of integrated circuit layers may comprise at least one memory array, a connecting point and an insulative material adjacent the connecting point. At least one aperture may be formed through at least some integrated circuit layers of the plurality of integrated circuit layers. The at least one aperture may comprise a first transverse cross-sectional dimension through the connecting point and a second, different, transverse cross-sectional dimension through the insulative material. A conductive material may be disposed in at least a portion of the at least one aperture.

While certain embodiments have been described and shown in the accompanying drawings, such embodiments are merely illustrative and not restrictive of the scope of the invention, and this invention is not limited to the specific constructions and arrangements shown and described, since various other additions and modifications to, and deletions from, the described embodiments will be apparent to one of ordinary skill in the art. Thus, the scope of the invention is only limited by the literal language, and equivalents, of the claims, which follow.

What is claimed is:

1. A semiconductor device, comprising:
a conductive trace adjacent to an insulative material; and
an interconnect structure extending entirely through the conductive trace, traversing a contact end of the conductive trace, and through the insulative material, the interconnect structure comprising:
at least one conductive material extending through an aperture defined at least in part by the conductive trace and the insulative material, a portion of the at least one conductive material comprising a sidewall traversing the insulative material, the sidewall defining a transverse cross-sectional dimension through the insulative material; and
another portion of the at least one conductive material comprising another sidewall traversing the contact end of the conductive trace, the another sidewall defining a transverse cross-sectional dimension through the conductive trace differing from the cross-sectional dimension through the insulative material, a silicide disposed on the contact end of the conductive trace, the at least one conductive material being in direct contact with the silicide,
the another sidewall offset from the sidewall, and
a conductive material, of the at least one conductive material, disposed centrally to a transverse cross-sectional dimension of the aperture, disposed centrally to the transverse cross-sectional dimension through the insulative material, disposed centrally to the transverse cross-sectional dimension through the conductive trace, and at least partially extending, within the aperture, laterally past one of the contact end of the conductive trace and a surface of the insulative material.

2. The semiconductor device of claim 1, wherein the another portion of the at least one conductive material overhangs the portion of the at least one conductive material.

3. The semiconductor device of claim 1, wherein the portion of the at least one conductive material overhangs the another portion of the at least one conductive material.

4. The semiconductor device of claim 1, wherein the contact end of the conductive trace is recessed into the insulative material.

5. The semiconductor device of claim 1, further comprising a seed material at least partially between the interconnect structure and at least one of the insulative material and the conductive trace.

6. The semiconductor device of claim 1, wherein the conductive trace comprises a doped silicon.

7. The semiconductor device of claim 1, wherein the silicide disposed on the contact end of the conductive trace comprises a nickel silicide.

8. The semiconductor device of claim 1, wherein the at least one conductive material comprises at least one of tungsten (W), copper (Cu), aluminum (Al), palladium (Pd), cobalt (Co), ruthenium (Ru), nickel (Ni), and platinum (Pt).

9. The semiconductor device of claim 1, wherein the transverse cross-sectional dimension through the conductive trace is smaller than the transverse cross-sectional dimension through the insulative material.

10. The semiconductor device claim 1, wherein the transverse cross-sectional dimension through the conductive trace is larger than the transverse cross-sectional dimension through the insulative material.

11. The semiconductor device of claim 1, wherein the transverse cross-sectional dimension through the insulative material is less than or equal to about 500 nm.

12. The semiconductor device of claim 1, wherein the transverse cross-sectional dimension through the conductive trace differs from the transverse cross-sectional dimension through the insulative material by about 10 nm to about 50 nm.

13. The semiconductor device of claim 1, wherein the interconnect structure tapers through at least one of the conductive trace and insulative material.

14. The semiconductor device of claim 1, wherein the insulative material comprises a dielectric material selected from the group consisting of silicon dioxide ($SiO_2$), phosphosilicate glass (PSG), and borophosphosilicate glass (BPSG).

15. A method of forming a semiconductor device, comprising:
forming an aperture through an insulative material and through a conductive trace adjacent to the insulative material;
removing material from one of the insulative material and the conductive trace to form a partially-expanded aperture and to form a surface of the insulative material offset from a contact end of the conductive trace, the surface of the insulative material and the contact end of the conductive trace exposed in the partially-expanded aperture;
forming a silicide on the contact end of the conductive trace exposed in the partially-expanded aperture; and
filling the partially-expanded aperture with at least one conductive material to form an interconnect structure extending entirely through the conductive trace traversing the contact end of the conductive trace, and through the insulative material, the interconnect structure comprising:
the at least one conductive material extending through the partially-expanded aperture defined at least in part by the conductive trace and the insulative material, a portion of the at least one conductive material comprising a sidewall traversing the surface of the insulative material, the sidewall defining a transverse cross-sectional dimension through the insulative material; and
another portion of the at least one conductive material comprising another sidewall traversing the contact end of the conductive trace, the another sidewall defining a transverse cross-sectional dimension through the conductive trace differing from the cross-sectional dimension through the insulative material, the silicide disposed on the contact end of the conductive trace, the at least one conductive material being in direct contact with the silicide, conductive trace,
the another sidewall offset from the sidewall, and
a conductive material, of the at least one conductive material, disposed centrally to a transverse cross-sectional dimension of the partially-expanded aperture, disposed centrally to the transverse cross-sectional dimension through the insulative material, disposed centrally to the transverse cross-sectional dimension through the conductive trace, and at least partially extending, within the aperture, laterally past one of the contact end of the conductive trace and the surface of the insulative material.

16. The method of claim 15, wherein:
removing material from one of the insulative material and the conductive trace comprises removing material from the conductive trace without substantially removing material from the insulative material, and
the transverse cross-sectional dimension through the conductive trace is greater than the transverse cross-sectional dimension through the insulative material.

17. The method of claim 15, wherein:
removing material from one of the insulative material and the conductive trace comprises removing material from the insulative material without substantially removing material from the conductive trace, and
the transverse cross-sectional through the conductive trace is less than the transverse cross-sectional dimension through the insulative material.

18. The method of claim 15, wherein forming a silicide on the contact end of the conductive trace comprises reacting nickel with silicon in the conductive trace at the contact end of the conductive trace.

19. A semiconductor device, comprising:
a conductive trace adjacent to an insulative material; and
an interconnect structure extending entirely through the conductive trace, the interconnect structure comprising:
at least one conductive material extending through an aperture defined at least in part by the conductive trace and the insulative material, a portion of at least one conductive material comprising a sidewall traversing the insulative material; and
another portion of the at least one conductive material comprising another sidewall traversing a contact end of the conductive trace, a silicide disposed on the contact end of the conductive trace, the at least one conductive material being in direct contact with the silicide,
the portion of the at least one conductive material overhanging the another portion of the at least one conductive material,
the another sidewall offset from the sidewall, and
a conductive material, of the at least one conductive material, disposed centrally to a transverse cross-sectional dimension of the aperture and at least partially extending, within the aperture, laterally past one of the contact end of the conductive trace and a surface of the insulative material.

20. A semiconductor device, comprising:
a conductive trace adjacent to an insulative material; and
an interconnect structure comprising:
at least one conductive material extending through an aperture defined at least in part by the conductive trace and the insulative material, a portion of at least one conductive material comprising a sidewall traversing the insulative material; and another portion of the at least one conductive material comprising another sidewall traversing a contact end of the conductive trace, a silicide disposed on the contact end of the conductive trace, the contact end of the conductive trace being recessed into the insulative material, the another sidewall offset from the sidewall, and a conductive material, of the at least one conductive material, disposed centrally to a transverse cross-sectional dimension of the aperture and at least partially extending, within the aperture, laterally past one of the contact end of the conductive trace and a surface of the insulative material.

\* \* \* \* \*

UNITED STATES PATENT AND TRADEMARK OFFICE
CERTIFICATE OF CORRECTION

PATENT NO.        : 9,111,932 B2
APPLICATION NO.   : 14/191086
DATED             : August 18, 2015
INVENTOR(S)       : Gurtej S. Sandhu et al.

It is certified that error appears in the above-identified patent and that said Letters Patent is hereby corrected as shown below:

In the claims:

CLAIM 10, COLUMN 11, LINE 18,    change "device claim 1" to --device of claim 1--

CLAIM 15, COLUMN 12, LINE 6,     change "silicide, conductive trace," to --silicide,--

Signed and Sealed this
First Day of March, 2016

Michelle K. Lee
*Director of the United States Patent and Trademark Office*